US009665682B1

(12) United States Patent
Guimarães et al.

(10) Patent No.: US 9,665,682 B1
(45) Date of Patent: May 30, 2017

(54) METHODS, SYSTEMS, AND ARTICLES OF MANUFACTURE FOR ENHANCING FORMAL VERIFICATION WITH COUNTER ACCELERATION FOR ELECTRONIC DESIGNS

(71) Applicant: Cadence Design Systems, Inc., San Jose, CA (US)

(72) Inventors: Breno Rodrigues Guimarães, Minas Gerais (BR); Abner Luis Panho Marciano, Minas Gerais (BR); Fabiano Peixoto, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/871,847

(22) Filed: Sep. 30, 2015

(51) Int. Cl.
*G06F 17/50* (2006.01)
(52) U.S. Cl.
CPC ...... *G06F 17/5081* (2013.01); *G06F 17/5072* (2013.01); *G06F 17/5077* (2013.01)
(58) Field of Classification Search
CPC .. G06F 17/504; G06F 17/5045; G06F 17/505; G06F 17/5068
USPC .................................................. 716/110, 111
See application file for complete search history.

(56) References Cited

U.S. PATENT DOCUMENTS

| 7,418,678 B1* | 8/2008 | Ip et al. ............... G06F 17/504 716/106 |
| 7,752,592 B2* | 7/2010 | Butter ................ G06F 17/5054 326/38 |
| 8,032,848 B2* | 10/2011 | Moon .................. G06F 17/504 703/4 |
| 8,527,911 B1* | 9/2013 | Kranen et al. ...... G06F 17/5022 716/136 |

* cited by examiner

*Primary Examiner* — Sun Lin
(74) *Attorney, Agent, or Firm* — Vista IP Law Group, LLP

(57) ABSTRACT

Disclosed are techniques for enhancing formal verification with counter acceleration for electronic designs. These techniques identify at least a portion of an electronic design including a counter having a current counter value and intercept next counter values transmitted to the counter with a counter abstraction module. These techniques further determine whether to accelerate the counter from the current counter value to an engine synthesized next counter value, rather than to an original next counter value based at least in part on a set of critical values. The counter is accelerated from the current counter value to the engine synthesized next counter value when the counter abstraction module determines to accelerate the counter.

20 Claims, 13 Drawing Sheets

METHODS, SYSTEMS, AND ARTICLES OF MANUFACTURE FOR ENHANCING FORMAL VERIFICATION WITH COUNTER ACCELERATION FOR ELECTRONIC DESIGNS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Formal verification has been widely used in providing a formal proof of electronic designs to prove the correctness of electronic designs. Modern electronic designs have grown exponentially in both their sizes and complexities and have thus rendered formal verification increasingly harder. Counters have been widely used in digital portions of electronic designs. A counter is an electronic device that often functions in conjunction with clock signals and stores the number of times a particular event has occurred. Counters affect the performance of formal engines by, for example, increasing the sequential depth for formal engines. For example, the number of iterations in the reachability analysis of formal verification may be proportional to the number of possible counts in the counters. Counters may not necessarily be assigned some arbitrary values because specific values for counters as well as relationships among counters may be of some particular significance to an electronic design, and arbitrarily assigned values may nevertheless lead to undesirable or unreliable verification results.

Therefore, there exists a need for a method, system, and computer program product for enhancing formal verification with counter acceleration for electronic designs.

SUMMARY

Disclosed are method(s), system(s), and article(s) of manufacture for enhancing formal verification with counter acceleration for electronic designs in various embodiments. Some first embodiments are directed at a method for enhancing formal verification with counter acceleration for electronic designs. In these embodiments, at least a portion of an electronic design that includes a counter having a current counter value and further includes design components operatively connected to the counter may be identified. A counter abstraction module may be used to intercept next counter values that are to be transmitted to the counter. A determination may be made as to whether the counter is to be accelerated from the current counter value to an engine synthesized next counter value, rather than to an original next counter value, based in part or in whole upon a set of critical values.

In some of these embodiments, the counter abstraction module may be inserted before a counter's memory or storage element to intercept the next counter values before the next counter values are received. In addition, the set of critical values at least one of which is compared to or with the current counter value may be identified. In some of these immediately preceding embodiments, the counter abstraction module may receive the current counter value from the counter, the original next counter value from an increment logic module, and at least two critical values from the set of critical values.

In addition or in the alternative, a multiplexer that receives at least the original next counter value and the engine synthesized next counter value as inputs may be identified; and either the original next counter value or the engine synthesized next counter value may be selected based in part or in whole upon one or more criteria. In some embodiments, a determination may be made to decide whether the engine synthesized next counter value is valid. To decide whether the engine synthesized next counter value is valid, the counter abstraction module may receive the current counter value from the counter, the engine synthesized next counter value, at least two critical values from the set of critical values, and the original next counter value. In some of these embodiments, a select signal for the multiplexer may be generated based in part or in whole upon the at least two critical values, the original next counter value, the current counter value, and the engine synthesized next counter value. Either the original next counter value or the engine synthesized next counter value may be selected based in part or in whole upon the select signal. The counter may then be accelerated from the current counter value to the engine synthesized next counter value when the select signal enables the counter abstraction module to accelerate the counter.

In some embodiments where the counter abstraction module may be disabled. In these embodiments, one or more reset signals, one or more valid signals, one or more expressions, or any combinations thereof may be aggregated into a disable signal. A determination may be made to decide whether the disable signal is received to prevent the counter abstraction module from acting. The counter abstraction module may be disabled with the disable signal, and the original next counter value, rather than the engine synthesized next counter value, may be selected by the counter abstraction module to transmit to update the counter.

To determine whether the counter is to be accelerated in some embodiments, a direction in which the counter is progressing may be detected; at least two critical values that range the current counter value from the set of critical values may be determined from the set of critical values; a valid range may be determined based in part or in whole upon the two critical values, the current counter value, and the original next counter value; and whether the engine synthesized next counter value falls within the valid range. In some of these embodiments, the valid range exclusively includes the original next counter value as a lower bound and inclusively includes one of the two critical values as an upper bound.

Some embodiments are directed at one or more hardware mechanisms and modules that include and/or function in conjunction with at least one micro-processor as well as other related components or architectures of one or more computing systems and may be invoked to perform any of the methods, processes, or sub-processes disclosed herein.

Each of these mechanisms may include or function in tandem with electrical circuitry and one or more micro-processors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A mechanism or module is initialized in a computing system so that the software portion of the mechanism or module is stored in memory (e.g., random access memory) to be executed by one or more processors or processor cores off the computing system to perform at least a part of the functionality of the mechanism. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for enhancing formal verification with counter acceleration for electronic designs are described below with reference to FIGS. 1-7.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments are directed to a method, system, and computer program product for enhancing formal verification with counter acceleration for electronic designs. Other objects, features, and advantages of the invention are described in the detailed description, figures, and claims.

In some embodiments, a counter abstraction mechanism or module is inserted immediately before a counter or before a memory or storage element of a counter so that the counter abstraction mechanism or module intercepts the next counter values before the next counter values are received at the counter. A counter abstraction mechanism or module is an artificially created mechanism or module that is not a part of the electronic design under verification. One of the purposes of inserting such an artificially created counter abstraction mechanism or module into an electronic design as described above is to intercept next counter values before the next counter values are received and stored in the counter.

The counter abstraction mechanism or module includes a counter value synthesis mechanism module (e.g., 112) that determines or selects an engine synthesized next counter value. The counter abstraction mechanism or module also receives original next counter values generated by, for example, the increment logic module or mechanism (e.g., 108 of FIG. 1) that may constitute a part of the electronic design under verification. Also included in the counter abstraction mechanism or module is a multiplexer (Mux) that selects between an original next counter value and an engine synthesized next counter value based on a select signal generated by a prediction mechanism or module (e.g., 106 in FIG. 1).

Figure 4:
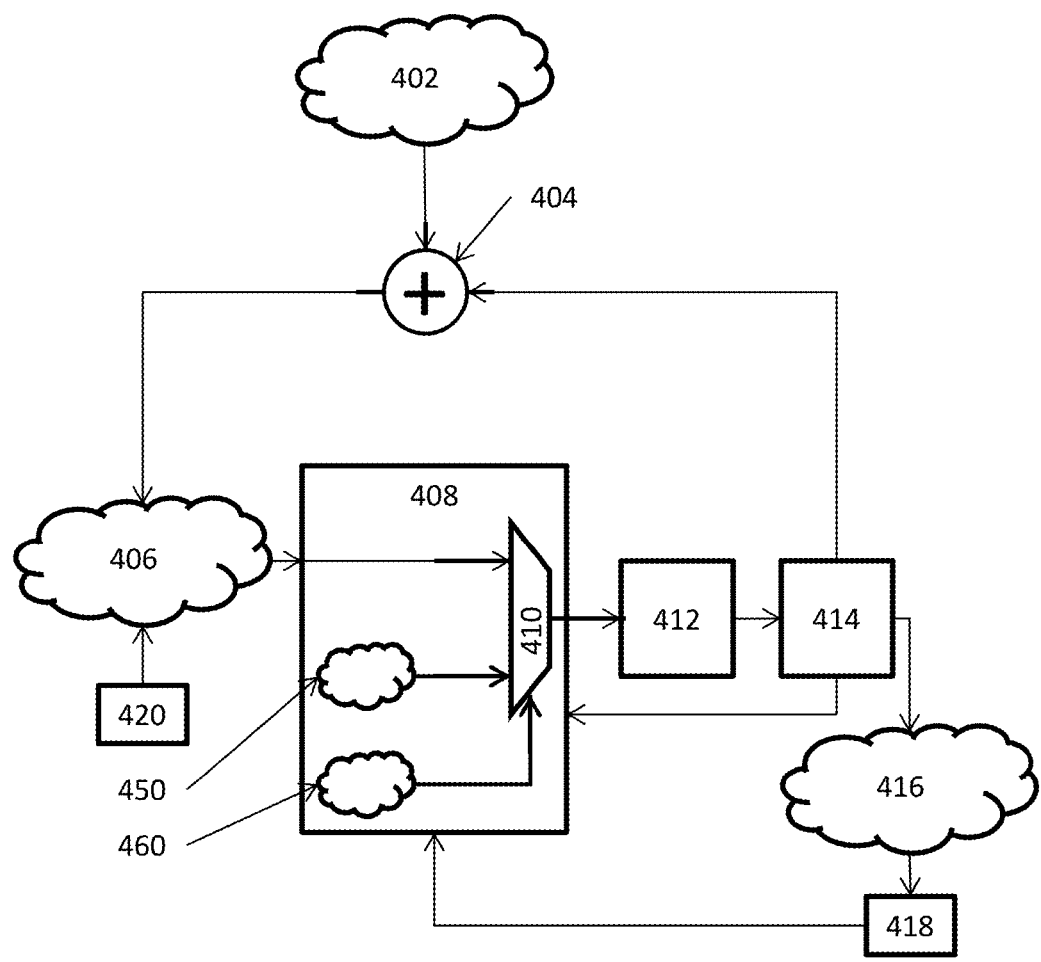
FIG. 4 illustrates a simplified diagram for an example of counter acceleration mechanisms for electronic designs in one or more embodiments.

The prediction module receives the current counter value, a set of critical values generated or identified by a critical value mechanism or module (e.g., 104), an engine synthesized next counter value, and an original next counter value and determines whether or not the counter abstraction mechanism or module is allow to act or whether or not the counter is to receive the original next counter value or the engine synthesized next counter value. Based on the select signal generated by the prediction mechanism or module, the multiplexer selects either the engine synthesized next counter value or the original next counter value from the increment logic to accelerate the counter. In some embodiments where reset or disable logic is coupled with the increment logic, one or more reset signals, one or more valid signals, one or more expressions, or any combinations thereof (collectively one or more disable signals) may also be transmitted to the multiplexer for the multiplexer to select the engine synthesized next counter value, the original next counter value, or the one or more disable signals to determine which value is to be selected for the counter. One example of selecting the engine synthesized next counter value, the original next counter value, or the one or more disable signals for the counter is illustrated in FIG. 4. When an engine synthesized next counter value is selected and transmitted by the counter abstraction mechanism or module to the counter, the counter is accelerated from its current counter value to the engine synthesized next counter value while bypassing one or more counter values in between.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-7.

Figure 1:
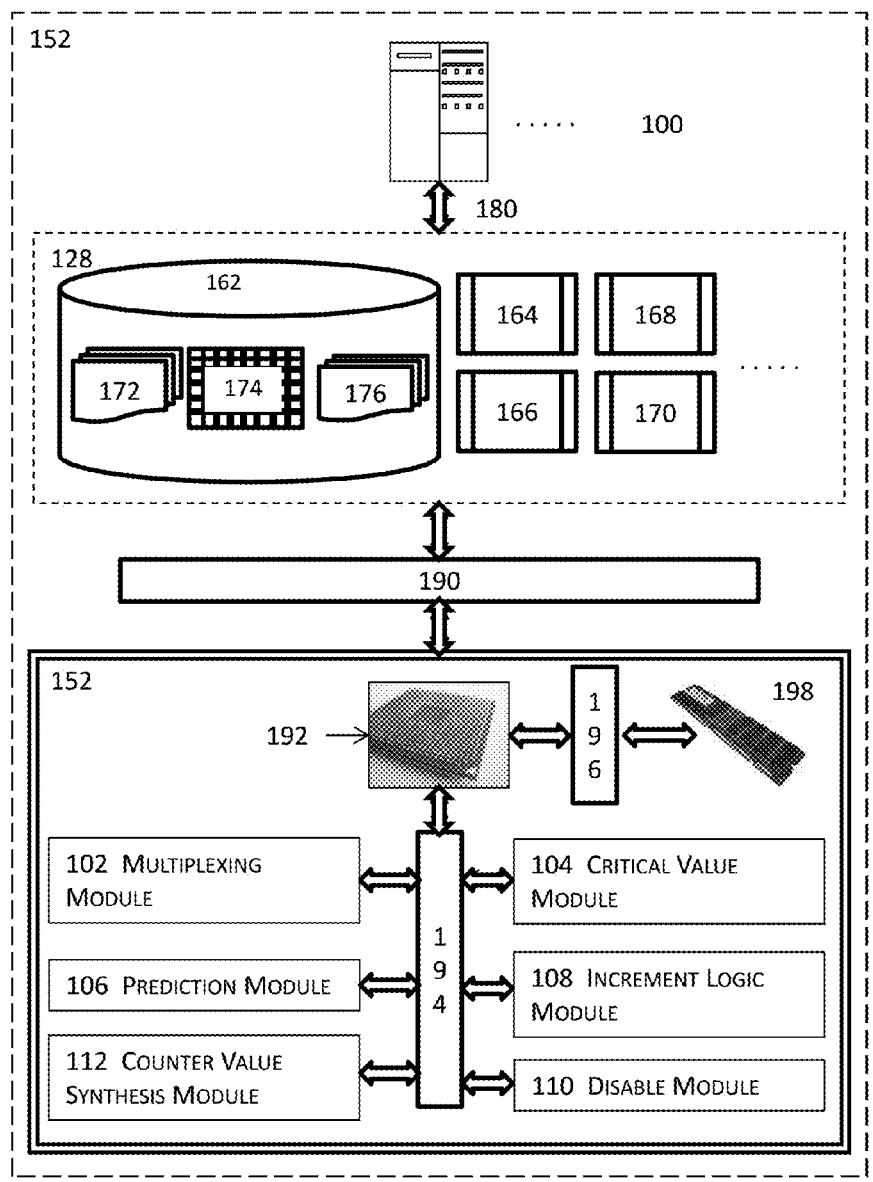
FIG. 1 illustrates a high level schematic block diagram for enhancing formal verification with counter acceleration for electronic designs in one or more embodiments.

FIG. 1 illustrates a high level schematic block diagrams for enhancing formal verification with counter acceleration for electronic designs in one or more embodiments. More specifically, FIG. 1 illustrates an illustrative high level schematic block diagrams for enhancing formal verification with counter acceleration for electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms 152 including hardware and/or software mechanisms and modules or combinations of one or more hardware and one or more software mechanisms or modules. Each of these mechanisms or modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A mechanism or module may be initialized in a computing system so that the software portion of the mechanism is stored in memory (e.g., random access memory) to be executed by one or more processors or processor cores off the computing system to perform at least a part of the functionality of the mechanism or module. Some illustrative mechanisms, modules, or components of the hardware system may be found in the System Architecture Overview section below.

The set of mechanisms 152 may comprises a multiplexing mechanism or module 102 to select one of its inputs for outputs based on a select signal (e.g., a signal generated by a prediction module 106). The set of mechanisms 152 may also include a critical value mechanism or module 104 to generate or identify a set of critical values that may be compared to or with the next counter values.

The set of mechanisms 152 may further optionally include a prediction mechanism or module 106 to predict whether original next counter values or engine synthesized next counter values are to be used. In addition or in the alternative, the set of mechanisms 152 may include an increment logic mechanism or module 108 to determine the original next counter values for a counter when it is determined that the current counter value is not to be accelerated.

The set of mechanisms 152 may include a disable mechanism or module 110 that functions in tandem with, for example, the prediction mechanism or module 106 and/or the multiplexing mechanism or module 102 to determine whether the counter abstraction mechanism is allowed to act, whether the counter abstraction mechanism or module is to be disabled, and/or whether the counter is to be reset to a predetermined value or state (e.g., a predetermined counter value provided by a reset signal) in some embodiments. The set of mechanisms 152 may also include a counter value synthesis mechanism or module 112 to determine or select an engine synthesized next counter value to which the current counter value of a counter may be accelerated while bypassing one or more next counter values between the current counter value and the engine synthesized next counter value. In some embodiments, the multiplexing mechanism or module 102, the prediction mechanism or module 106, and the counter value synthesis mechanism or module 112 may be a part of a counter abstraction mechanism or module; and the critical value mechanism or module 104, the increment logic mechanism or module 108, and/or the disable mechanism or module 110 may be a part of an electronic design including a counter that constitutes one of the targets for formal verification.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
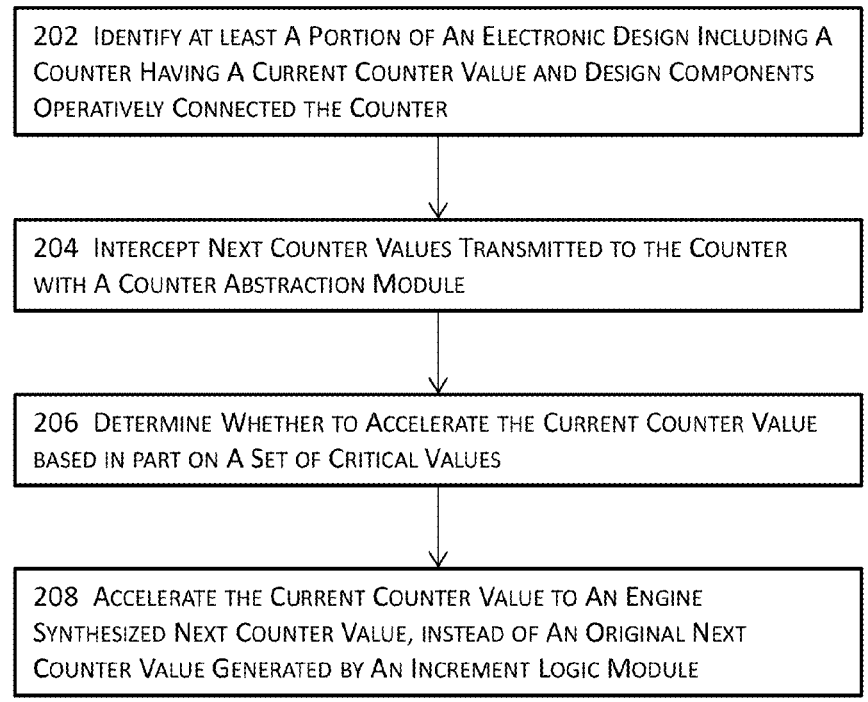
FIG. 2 illustrates a high level block diagram for enhancing formal verification with counter acceleration for electronic designs in one or more embodiments.

FIG. 2 illustrates a high block diagram for enhancing formal verification with counter acceleration for electronic designs in one or more embodiments. In these one or more embodiments, at least a portion of an electronic design that includes a counter having a current counter value and one or more design components associated with or functioning in tandem with the counter may be identified at 202. These one or more design components may include, for example, increment logic mechanism or module that uses its increment logic to determine the next counter value for the counter in some embodiments. Normally, the increment logic mechanism or module determines how the current counter value is incremented. That is, absent the counter acceleration techniques, a counter would increment its counter values according to the original next counter values generated by the increment logic mechanism or module to count and store the number of occurrences a particular event or process has occurred. These one or more design components may also include a memory element (e.g., one or more registers or flip-flops, etc.) for storing, for example, the current value that may also be displayed in some embodiments.

An increment logic module includes a module that dictates how a counter value may be updated from a current counter value to an original next counter value in some embodiments. An increment module may further include one or more modules performing one or more arithmetic and/or logic operations (e.g., an addition operation, any other suitable arithmetic or logic operations, or any combinations thereof), determining and transmitting one or more disable signals, determining and transmitting one or more values corresponding to at least some of the one or more disable signals, or any combinations thereof in some of these embodiments. In some embodiments where the increment logic is also coupled with reset logic which controls whether to reset the counter to a prescribed value with a reset signal, the one or more design components may further use the memory element to store the prescribed value when the reset signal is active, and the counter abstract is determined not to accelerate the counter to an engine synthesized next counter value.

Next counter values are intercepted at 204 with a counter abstraction mechanism or module before these next counter values are received at the counter. A counter abstraction mechanism or module is an artificially created mechanism or module that is not a part of the electronic design under verification. That is, a counter abstraction mechanism is not a part of the electronic design and is not to be manufactured to become a part of an electronic device represented by a version of the electronic design (e.g., a signed-off version of the electronic design).

A counter abstraction mechanism or module is thus artificially created to serve a purpose of accelerating the counter so as to save computational resources (e.g., the sequential depth of formal proof, the processing time, memory footprint, etc.) These next counter values may include original next counter values generated by, for example, increment logic for the counter in some embodiments. These next counter values may also include engine synthesized next counter values that are determined or identified by the counter abstraction itself (or more precisely, the counter value synthesis mechanism or module in the counter abstraction).

A determination may be made at 206 as to whether or not the current counter value at a counter is to be accelerated. In some embodiments, the determination may be made based in part upon a set of critical values generated or identified by, for example, the critical value mechanism or module 104. The set of critical values include a plurality of critical values that may be compared to or with one or more counter values (e.g., an original next counter value, an engine synthesized next counter value, etc.) A critical value in the set includes a counter value or state of significance upon which one or more intended functions or correctness of the electronic design or a portion thereof depends.

A set of critical values may be determined in several different ways. In some embodiments, a set of critical values may be determined based in part or in whole upon a structural analysis that is performed on the hardware structure of an electronic design or a portion thereof. In these embodiments where only one or more structural analyses are performed for the determination of a set of critical values, functional analyses that examine the functions or logic of the electronic design are often, but not necessarily always, ignored. For example, a set of critical values may be identified by analyzing the structure of an electronic circuit and identifying a counter whose values are compared to or with one or more constants. These one or more constants may be identified into a set of critical values because these values may represent scenarios of interest or states at which the counter having a certain value may alter the behavior of at least a portion of the underlying electronic circuit. An example of determining critical values from structural analyses may include a circuit portion that is configured to perform the following:

(1) if (&cnt) perform A;

(2) if (!&cnt[1:0] &&cnt[3:2]) perform B;

When a structural analysis identifies the above circuit portion, the structural analysis determines that the counter values are limited to 1100, 1101, and 1110, and these three values may thus be added to a set of critical values.

For a counter, the theoretical lowest possible counter value and the theoretical highest possible counter value may also be identified into the set of counter values, at least for the counter under consideration. For example, a counter "cnt[3:0]" having a width of four bits may have the theoretical lowest possible counter value of "0" and the theoretical highest possible counter value of "15". In this example, both the theoretical lowest and highest possible counter values may be identified into a set of critical values, at least as far as the counter is concerned. In some embodiments, the theoretical lowest and/or highest possible counter values includes an unsigned value.

In some embodiments where certain logic of an electronic design may limit the possible range of a counter. In the aforementioned example with the counter "cnt[3:0]", certain logic may limit the practical highest counter value to, for example, "8", instead of the theoretical highest counter value of "15". In this example, both the theoretical lowest and highest possible counter values of "0" and "15" are nevertheless identified into the set of critical values, rather than the practical highest counter value "8". Nonetheless, the practical counter value "8" may still be identified into the set of critical values not because "8" represents the practical counter value "8" but because the counter value may be compared to or with this practical highest possible counter value "8" due to the logic that imposes the limit on the highest possible counter value. In this example, the set of critical values may thus include {0, 8, 15}. In some embodiments, a practical highest possible counter value may be automatically identified into a set of critical values, regardless of whether the counter value of the counter of interest is in fact compared to or with the practical highest possible counter value.

In some other embodiments, a set of critical values may also include one or more critical values identified by a user. In the aforementioned example of the set of critical values {0, 7, 15}, a user may identify, for example, one or more additional critical values (e.g., 3 and 11) so that the set of critical values may now include {0, 3, 7, 11, 15}. As a working example of counter acceleration with the example of a set of critical values of {0, 7, 15}, the electronic design or a portion thereof may proceed through the following state transitions: 0 ⇒ 2 ⇒ 3 ⇒ 4 ⇒ 5 ⇒ 6 ⇒ 7 ⇒ 8 ⇒ 9 ⇒ 10 ⇒ 11 ⇒ 12 ⇒ 13 ⇒ 14 ⇒ 15 ⇒ without counter acceleration. With the application of some of the counter acceleration techniques describe herein, the electronic design or the portion thereof may be accelerated and proceed through a reduced set of state transitions such as: 0 ⇒ 1 ⇒ 7 ⇒ 8 ⇒ 15. If a user introduces another critical value "11" into the set of critical values, the electronic design or the portion thereof may be accelerated and proceed through another reduced set of state transitions such as: 0 ⇒ 1 ⇒ 7 ⇒ 8 ⇒ 11 ⇒ 12 ⇒ 15.

Functional aspects or logic operators of an electronic design or a portion thereof may also be examined to determine critical values. For example, the signal of a reduced AND gate includes all ones "1 s", and signals of shifts that are greater than a signal width of interest have all zeros "0s". Another example of determining one or more critical values is that a counter may have the comparison of its counter value delayed by, for example, a flip-flop (e.g., a D flip-flop or DFF) or delayed by a number of clock cycles (e.g., one clock cycle). In some embodiments where the comparison of a counter's counter values is delayed, the increment logic may be analyzed to extract the delayed counter values, and one or more critical values due to the one or more logic operations involved may be determined accordingly.

A counter may or may not necessarily be accelerated to an engine synthesized next counter value. The counter abstraction mechanism or module needs to be allowed to intercept the original next counter value and engine synthesized next counter value and to determine whether the original next counter value or the engine synthesized next counter value is to be selected. In some embodiments, the counter abstraction mechanism or module may be allowed to act when the counter abstraction mechanism or module does not receive a disable signal, a reset signal, or any other signals that disable the counter abstraction mechanism or module to act.

One of the advantages of these counter acceleration techniques is that these counter acceleration techniques provide full support for and accommodate reset signals or custom expressions that may be received during at any time during verification of an electronic design or a portion thereof. This is in sharp contrast with conventional approaches which can only support reset signals in a simulation of a reset where the electronic design receives a reset signal during the first clock cycle, during which no events or processes other than reading information occur, of a whole range of a plurality of clock cycles while reset signals are ignored in remaining clock cycles in the range. In these conventional approaches, the electronic design under test is never rest starting from the second clock cycle when a module similar to a counter abstraction is present in the entire or at least a sufficiently large portion of the formal verification stage. In addition, the engine synthesized next counter value determined or selected by the counter value synthesis mechanism or module needs to be valid in order for the prediction mechanism or module in the counter abstraction mechanism or module to determine to accelerate the current counter value to the engine synthesized next counter value.

At 208, the counter may be accelerated to an engine synthesized counter value, instead of an original next counter value generated by the counter's increment logic mechanism or module, when one or more criteria are fulfilled. For example, the prediction module in the counter abstraction module may check the current counter value, a set of critical values, an original next counter value, and an engine synthesized next counter value to generate a select signal to instruct a multiplexer in the counter abstraction module to select the engine synthesized next counter value, instead of the original next counter value, and to transmit the selected engine synthesized next counter value to a storage element (e.g., flip-flop, register, etc.) of the counter. One of the advantages of these counter acceleration techniques is that these counter acceleration techniques described herein prevent the counter from staying at one particular state for some extended or undesirable number of clock cycles or time. More details about counter acceleration will be described below with reference to FIGS. 3A-D.

Another advantage of the counter acceleration techniques described herein is that these counter acceleration techniques also need not analyze the increment logic to build state transitions. An added advantage of not having to determine or calculate the transition states is that these counter acceleration techniques need not perform any structural analyses (e.g., an analysis that operates on the design structures, rather than or instead of the behaviors, of an electronic design and proceed through, for example, the increment logic to determine whether the counter may increase or decrease) to determine incremental values in order to support verification of the electronic design of interest.

It shall be noted that although no structural analyses are required, these techniques described herein nevertheless preserve all the structural information of the electronic design without blocking or disabling any portion of the electronic design under test in some embodiments. In these embodiments, these techniques described herein need no stop-at operations which, when invoked, typically disconnects a block of circuit components (e.g., a counter) from the original logic of the electronic design and hence block any further utilization or analyses of the structural information of at least the block of circuit components.

In these embodiments, conventional approaches requiring or using a stop-at operation will also block any further analyses that require structural information of the block of circuit components affected by the stop-at operation, whereas these counter acceleration techniques do not need such stop-at operations to achieve counter acceleration. For example, with these counter acceleration techniques, further analyses (e.g., an analysis to identify which signals belong to the fan-in of a block that would have been affected by a stop-at operation) may still be performed with these counter acceleration techniques, whereas conventional approaches requiring one or more stop-at operations will block such structural information from being further utilized.

Figure 3A:
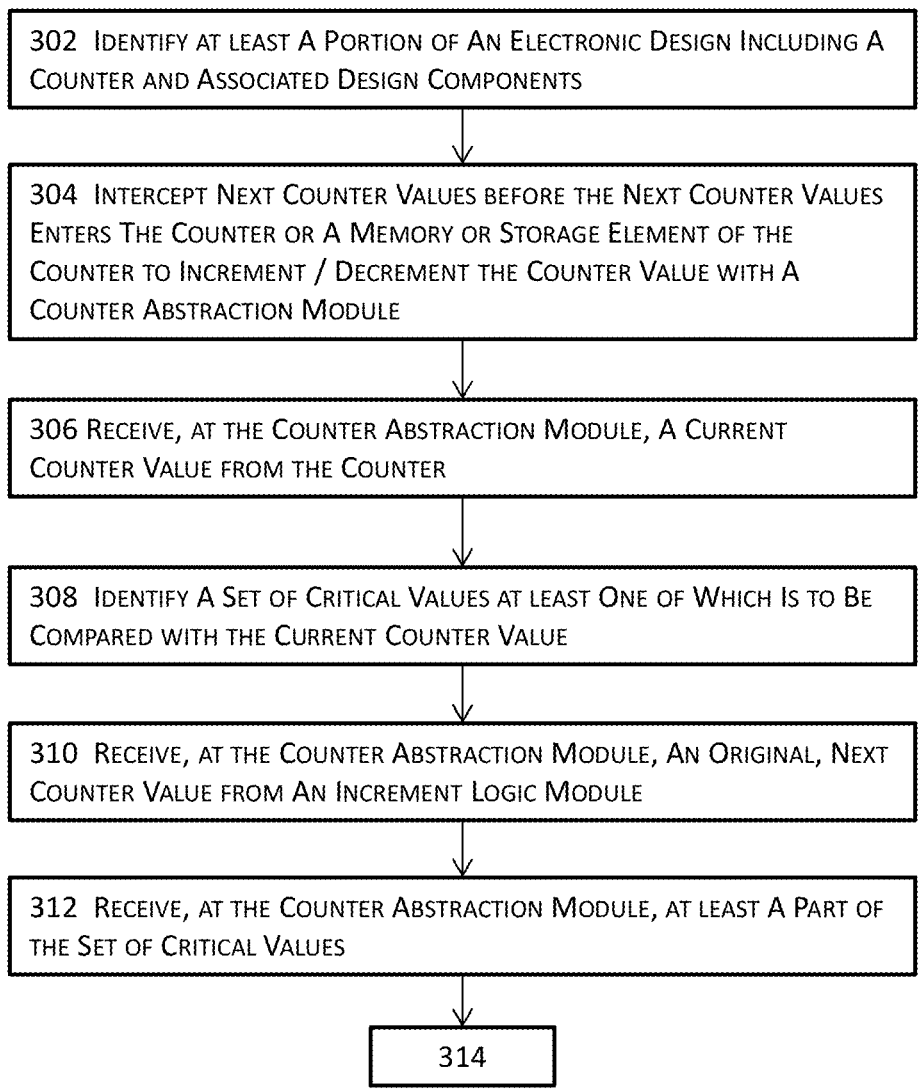
FIGS. 3A-C jointly illustrate a more detailed block diagram for enhancing formal verification with counter acceleration for electronic designs in one or more embodiments.
Figure 3B:
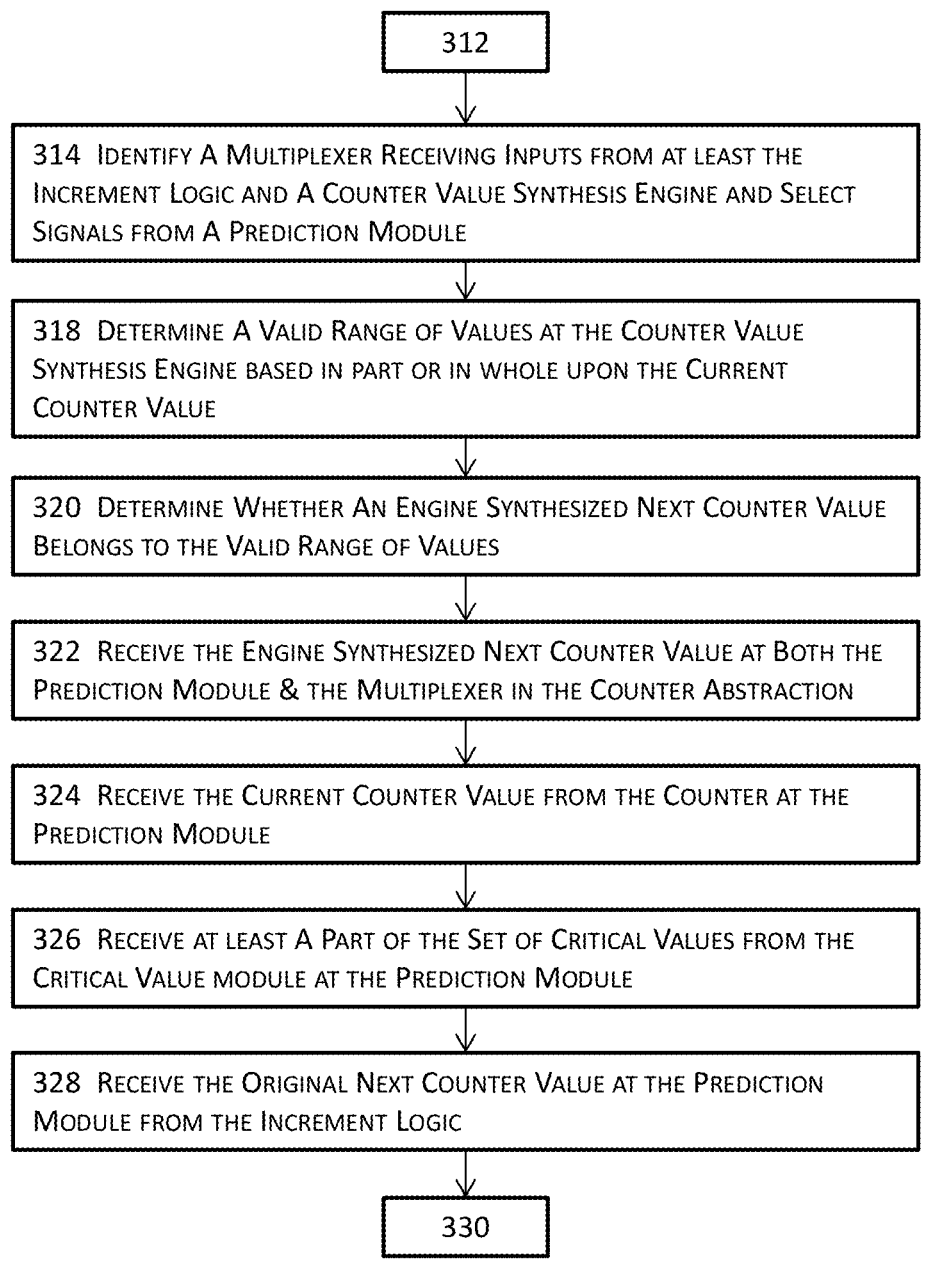
Figure 3C:
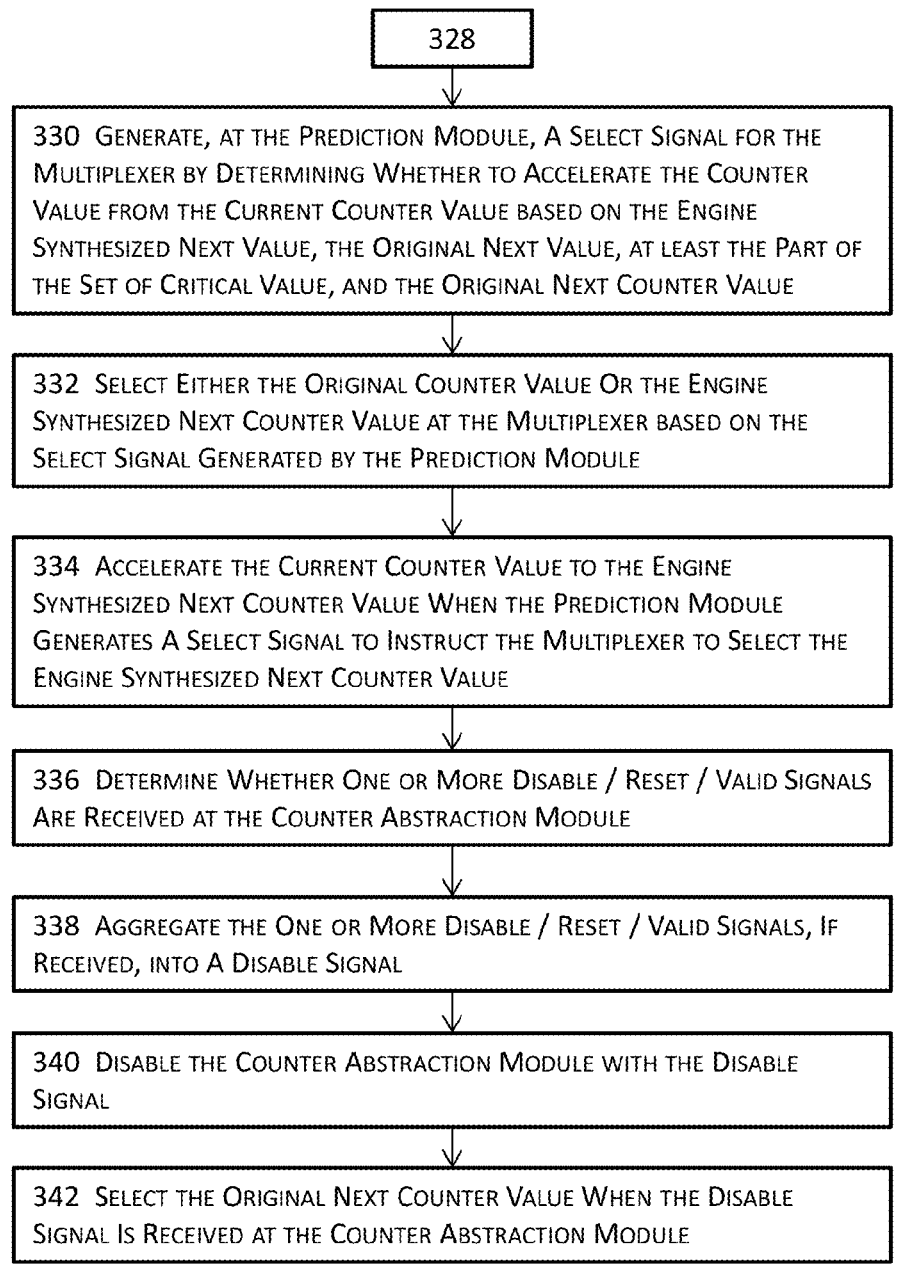

FIGS. 3A-C jointly illustrate a more detailed block diagram for enhancing formal verification with counter acceleration for electronic designs in one or more embodiments.

In these one or more embodiments, at least a portion of an electronic design may be identified at 302. The at least the portion of the electronic design or the entire electronic design may constitute the target for verification and may include, for example, a counter, a storage element for the counter, an increment logic module generating original next counter values, and a critical value module generating a set of critical values.

In some of these embodiments, the at least the portion of the electronic design may further include a logic module receiving and/or processing one or more reset signals, one or more custom expressions, or any other signals or expressions (e.g., custom expressions defined by a verification engineer) that set the counter to a predetermined state or value. Next counter values may be intercepted at 304 with a counter abstraction mechanism or module before these next counter values are received at the counter in the at least the portion of the electronic design. This may be achieved by inserting the counter abstraction mechanism or module between the increment logic mechanism or module and the counter in some embodiments. For example, a counter abstraction mechanism or module may be inserted immediately before the counter to intercept next counter values transmitted from, for example, the increment logic.

The counter abstraction mechanism or module may receive the current counter value indicative of the number of occurrences of an event or process may be received at 306 by, for example, pulling or requesting for the current counter value from the storage element of the counter. A set of critical values generated by, for example, a critical value mechanism or module (e.g., 104 in FIG. 1) may be identified at 308. As described above, a counter may or may not necessarily be accelerated to an engine synthesized next counter value. At least one critical value in the set may be compared to or with one or more counter values (e.g., an original next counter value, an engine synthesized next counter value, etc.) to aid the determination of whether to accelerate the current counter value in some embodiments. For example, a first critical value may be compared with an engine synthesized next counter value to determine a second critical value so that the first and second critical values range the engine synthesized next counter value. In some of these embodiments, a pair of critical values may be compared with an engine synthesized next counter value to determine whether the pair of critical values ranges the engine synthesized next counter value. A critical value in the set includes a value or state of significance upon which one or more intended functions or correctness of the electronic design or a portion thereof depends.

The counter abstraction mechanism or module may further identify by, for example, pulling or requesting for an original next counter value at 310 from the corresponding increment logic mechanism or module for the counter. In some embodiments where the increment logic mechanism or module includes or is coupled with reset logic having one or more reset signals to reset the counter to a prescribed state or value, the multiplexer (e.g., 410 in FIG. 4) in the abstraction mechanism or module may receive the prescribed state or value from the reset logic. Depending on the select signal generated by, for example, the prediction module 460, the multiplexer may select from the prescribed value or the engine synthesized next counter value as the output for the counter abstraction mechanism or module. In addition, the counter abstraction mechanism or module may further identify at least a part of the set of critical values by pulling or requesting for the at least the part of the set of critical values from, for example, the critical value mechanism or module (e.g., 104 in FIG. 1). In these embodiments, the counter abstraction mechanism or module receives four inputs—the current counter value from the counter, at least a part of a set of critical values from the critical value mechanism or module, the original next counter value from the increment logic mechanism or module, and the engine synthesized next counter value from the counter value synthesis mechanism or module.

At 314, a multiplexer may be identified in the counter abstraction mechanism or module. The multiplexer receives inputs from at least the increment logic mechanism or module in the at least the portion of the electronic design and a counter value synthesis mechanism or module in the counter abstraction mechanism or module and selects one of the inputs based on a select signal generated by a prediction module in the counter abstraction module. A valid range of values may be determined at 318 at the counter value synthesis module based in part or in whole upon the current counter value of the counter. A range of values is deemed valid if a pair of critical values in the set of critical values that ranges the current counter value also ranges the engine synthesized next counter value in some embodiments.

By a pair of critical values ranging a counter value (e.g., a current counter value, an engine synthesized next counter value, etc.), the counter value falls between the lower bound and the upper bound defined by the pair of critical values. For example, if the current counter value is 3, and the two critical values are 2 and 3 respectively, the range defined by the lower bound (2 in this example) and the upper bound (3 in this example) is deemed valid. FIGS. 5A-D provides some examples of state transitions as well as examples of valid ranges of values. A determination may be made at 320 to determine whether the engine synthesized next counter value belongs to the valid range identified at 318.

If the engine synthesized next counter value belongs to the identified valid range the prediction module in the counter abstraction module may generate a select signal to instruct the multiplexer to select the engine synthesized next counter value as the output when the counter abstraction module is allowed to act (e.g., receiving no disable signal). On the other hand, if the engine synthesized next counter value is determined not to belong to the identified range, the counter is determined not to be accelerated, and the prediction module in the counter abstraction module generates the select signal to instruct the multiplexer to select the original next counter value generated from the increment logic module as the output to the counter.

At 322, the engine synthesized next counter value may be received at both the prediction module in the counter abstraction module and the multiplexer as an input. The prediction module may also receive the current counter value from the counter at 324, a part of the set of critical values provided by the critical value module at 326, and the original next counter value generated by the increment logic module at 328. In these embodiments, the prediction modules receives four inputs—the engine synthesized next counter value from the counter value synthesis module, the current counter value from the counter, a part of the set of critical values provided by the critical value module, and the original next counter value and/or a prescribed reset value (if the increment logic module includes or is coupled with a reset module in some embodiments) generated by the increment logic module.

In some embodiments, the prediction module may also optionally receive a disable signal indicating whether the counter abstraction module is allowed to act (e.g., to accelerate the counter) although the disable signal may be received at another portion of the counter abstraction module and thus may not necessarily be received at the prediction module directly. Provided with these four inputs as described in these embodiments, the prediction module may generate a select signal at 330 to instruction the multiplexer to select one of its inputs as the output to the counter. Either the original counter value or the engine synthesized next counter value may be selected at 332 by the multiplexer based on the select signal generated by the prediction module.

For example, the prediction module may determine whether a disable signal preventing the counter abstraction module to act (e.g., to accelerate the counter) is received. If no such disable signal has been received to disable the counter abstraction module, the prediction module may identify two consecutive critical values from the set of critical values and determine whether these two critical values that range the current counter value also range the engine synthesized next counter value in some embodiments. It shall be noted that although the aforementioned example including four inputs to the prediction module, one or more other inputs may also be provided to the prediction module in order to generate the select signal for the multiplexer to select a desired or required input. In some other embodiments, the prediction module may identify two consecutive critical values from the set of critical values and determine whether these two critical values that range the engine synthesized next counter value also range the current counter value.

If it is determine that such two consecutive critical values that range both the current counter value and the engine synthesized next counter value, the engine synthesized next counter value is determined to be selected from a valid range and is closer to the next critical value than the original counter next value is, and the counter abstraction module may accelerate the current counter value to the engine synthesized next counter value. If it is determined that a disable signal has been received to disable the counter abstraction module, or if it is determined that no such disable signal is in effect, but the engine synthesized next counter value is not selected from a valid range, the prediction module may generate a select signal to instruct the multiplexer to select the original next counter value generated by the increment logic, rather than the engine synthesized next counter value, as the output to the counter. At 334, the counter may be accelerated from the current counter value to the engine synthesized next counter value when the prediction module generates a select signal to instruct the multiplexer to select the engine synthesized next counter value.

Blocks 336 through 342 are directed at determining whether the counter abstraction module is disabled and thus prevented from acting (e.g., from accelerating the counter) and may be performed at any stage and thus may not necessarily follow block 334. At 336, a determination may be made to decide whether one or more disable signals, one or more reset signals (.e.g., (rst1||(!rst1 && rst2)), one or more valid signals, one or more expressions, or any combinations thereof are received at the counter abstraction module. If the determination is affirmative, these one or more valid signals, one or more reset signals, one or more expressions, or any combinations thereof may be aggregated into a disable signal at 338.

The counter abstraction module may then be disabled with the disable signal at 340. Disabling the counter abstraction module does not necessarily require the functioning of the entire counter abstraction module or a part thereof be disabled, blocked (e.g., blocking one or more inputs and/or outputs), or otherwise rendered non-functional. Rather, disabling the counter abstraction module may include not accelerating the counter by, for example, instructing the multiplexer to select the original next counter values generated by the increment logic module at 342 while retaining all the structural information of the electronic design.

Figure 3D:
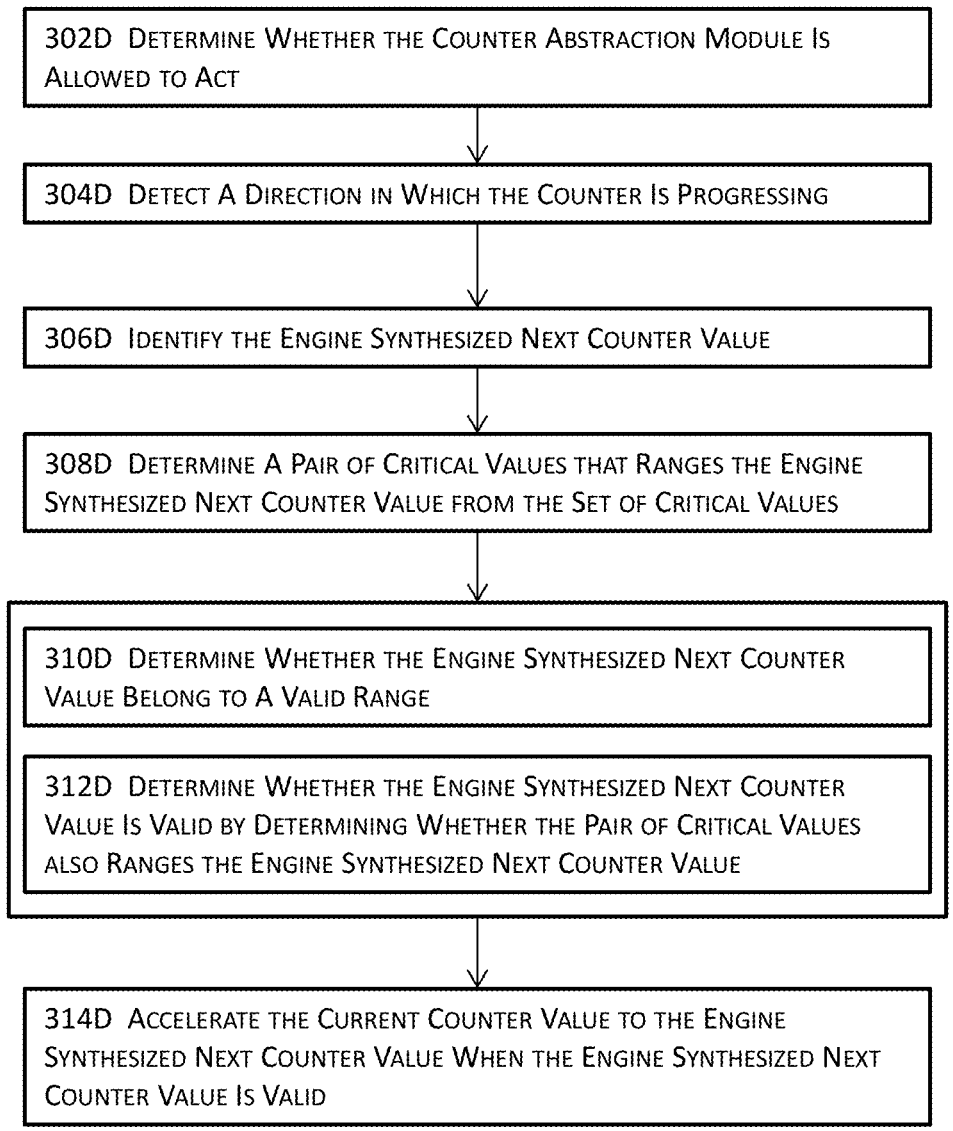
FIG. 3D illustrates a more detailed block diagram for enhancing formal verification with counter acceleration for electronic designs in one or more embodiments.

FIG. 3D illustrates a more detailed block diagram for enhancing formal verification with counter acceleration for electronic designs in one or more embodiments. More specifically, FIG. 3D illustrates a block diagram for determining whether to accelerate a counter value in these one or more embodiments. A determination may be made at 302D to decide whether the counter abstraction module is allowed to act. In some embodiments, determining whether a counter abstraction module is allowed to act may include checking whether the counter abstraction module has received a disable signal at the counter abstraction module or a part thereof. A disable signal may include one or more valid signals, one or more reset signals, one or more expressions, or any combinations thereof that may be aggregated into the disable signal in some embodiments.

A direction in which the counter is progress may be detected at 304D. An engine synthesized next counter value may be identified at 306D; and a pair of critical values that ranges the engine synthesized next counter value may be identified at 308D from the set of critical values. At 310D, a determination may be made to decide whether the engine synthesized next counter value belongs to a valid range. In the alternative, another determination may also be made at 312D to decide whether the engine synthesized next counter value is valid by deciding whether the pair of critical values determined at 308D ranges or includes the engine synthesized next counter value, and whether the engine synthesized next counter value is closer to the next critical value of the pair than the original next counter value is. The direction may be used to identify one or more pairs of critical values to determine a valid range of engine synthesized next counter values in some embodiments.

For example, given a current counter value of the counter and optionally the direction in which the counter is progressing (e.g., the incrementing direction), two immediately adjacent critical values that bound the current counter value may be identified from a set of critical values so that a first critical value closest to the current counter value may be first identified, and the immediately adjacent critical value may further be identified so that this pair of critical values range the engine synthesized next counter value in the direction of counter progression when the direction of counter progression is a factor to consider in some embodiments. A valid range may then be determined to be the range from the current counter value (exclusive) to the next, not-yet-reached critical value (inclusive) of the pair of critical values in some embodiments. If the determination at 310D or 312D is affirmative, the counter abstraction module may accelerate the counter at 314D from its current counter value to the engine synthesized next counter value while skipping one or more intermediate counter values between the current counter value and the engine synthesized next counter value.

FIG. 4 illustrates a simplified diagram for an example of counter acceleration mechanisms in a portion of an electronic design in one or more embodiments. In this example, the portion of the electronic design includes a counter 414 operatively coupled to a storage element 412 (e.g., one or more registers, flip-flops, etc.) and an increment logic module 402 that generates original next counter values or increments. In some embodiments where the increment logic module 402 generates counter increments, an original next counter value may be obtained by adding the current counter value from the counter 414 with an increment from the increment logic module 402 at the adder module 404. In some embodiments, an increment logic 402 may include, for example but not limited to, one or more modules of 404 (the adder module), a logic module 406 (the complex logic that may include reset signal(s), disable signal(s), valid signal(s), one or more associated modules, or any combinations thereof, etc.

The original next counter values may be transmitted to a logic module 406 (e.g., a sequential logic module, a combinational logic module, etc.) that may also receive one or more reset signals, one or more valid signals, one or more expressions, a disable signal, or any combinations thereof 420. These one or more reset signals, one or more valid signals, one or more expressions, a disable signal, or any combinations thereof may be used to determine whether the inserted counter abstraction module 408 is allowed to act. To accelerate the counter, a counter abstraction module 408 may be inserted before original next counter values are transmitted into the counter for storage. The counter abstraction module, as described above, receives the current counter value from the counter 414 as well as a set of critical values 418 via the critical value module 416. The counter abstraction module 408 may include a counter value synthesis module 450 and a prediction module 460. The counter abstraction module may further include a multiplexer 410 to select an input from the received inputs from the logic module 406 and the counter value synthesis module 450 based on a select signal generated by the prediction module 460.

Figure 5A:
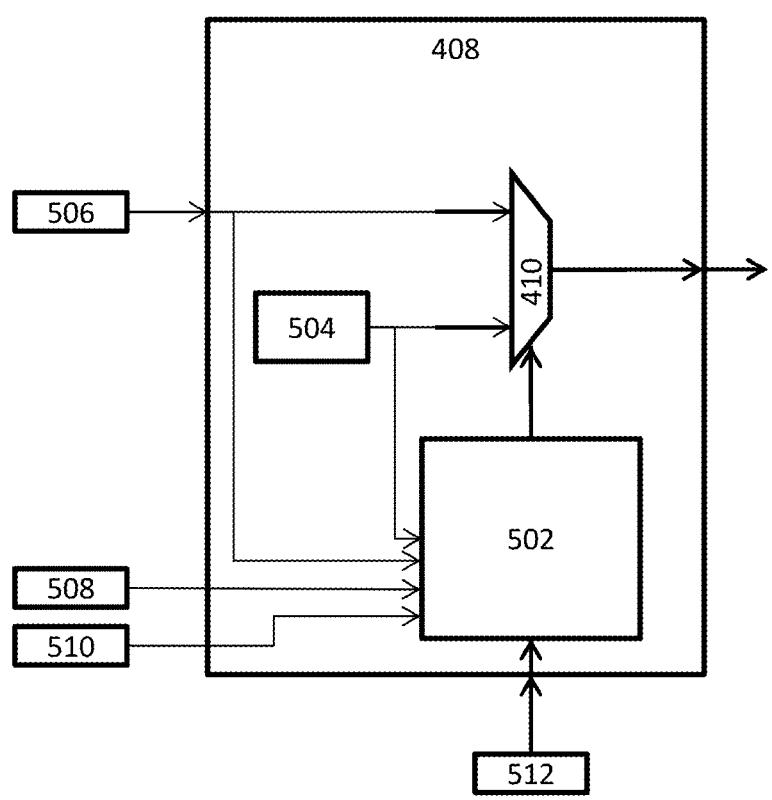
FIG. 5A illustrates a simplified diagram of an example for a counter abstraction module in one or more embodiments.

FIG. 5A illustrates a simplified diagram of an example for a counter abstraction module in one or more embodiments. More specifically, FIG. 5A illustrates more details about the counter abstraction module 408 in these one or more embodiments. In this example, the counter abstraction module 408 includes a counter value synthesis module 504 and a prediction module 502. The counter value synthesis module 504 generates and transmits the engine synthesized next counter values to the prediction module 502 and a multiplexer 410. The multiplexer also receives original next counter values 506 from, for example, the logic module (e.g., 406 in FIG. 4) and selects either an original next counter value or an engine synthesized next counter value based on a select signal generated by the prediction signal 502.

The prediction module 502 receives the current counter value 508 (e.g., from the counter 414), the original next counter value 508 (e.g., from the logic module 406), a plurality of critical values 510 (e.g., from the critical value module 416), and an engine synthesized next counter value 504. In some embodiments, the prediction module 502 may also receive a disable signal 512. In some embodiments where the prediction module 502 receives a disable signal 512 that prevents the counter abstraction module 408 from acting, the prediction module 502 generates a select signal to instruct the multiplexer 410 to select the original next counter value. On the other hand, if the prediction module 502 does not receive any disable signal (e.g., disable signal="0" or "low") to prevent the counter abstraction module 408 from acting, the prediction module 502 may further determine whether a pair of critical values ranges both the current counter value and the engine synthesized next counter value, and whether the engine synthesized next counter value is closer to the next critical value in the pair of critical values to decide whether to accelerate the counter from the current counter value to the engine synthesized next counter value.

Figure 5B:
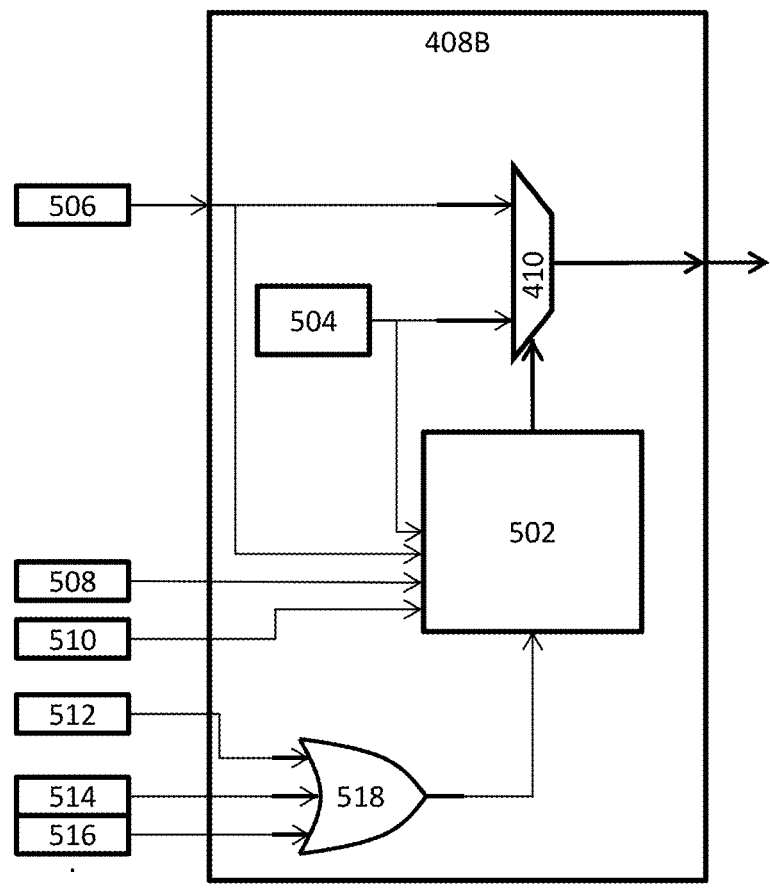
FIG. 5B illustrates another simplified diagram of an example for a counter abstraction module in one or more embodiments.

FIG. 5B illustrates another simplified diagram of an example for a counter abstraction module in one or more embodiments. The differences in this counter abstraction module example and the one illustrated in FIG. 5A are that the disable signal 512 together with one or more reset signals 514, one or more custom expressions 516, other similar signals (e.g., one or more valid signals that are not shown) are received at an electronic logic gate (e.g., an OR gate) 518, and these signals are aggregated by the electronic logic gate 518 into, for example, a disable signal before the disable signal is transmitted to the prediction module 502 to generate the corresponding select signal for the multiplexer 410.

Figure 5C:
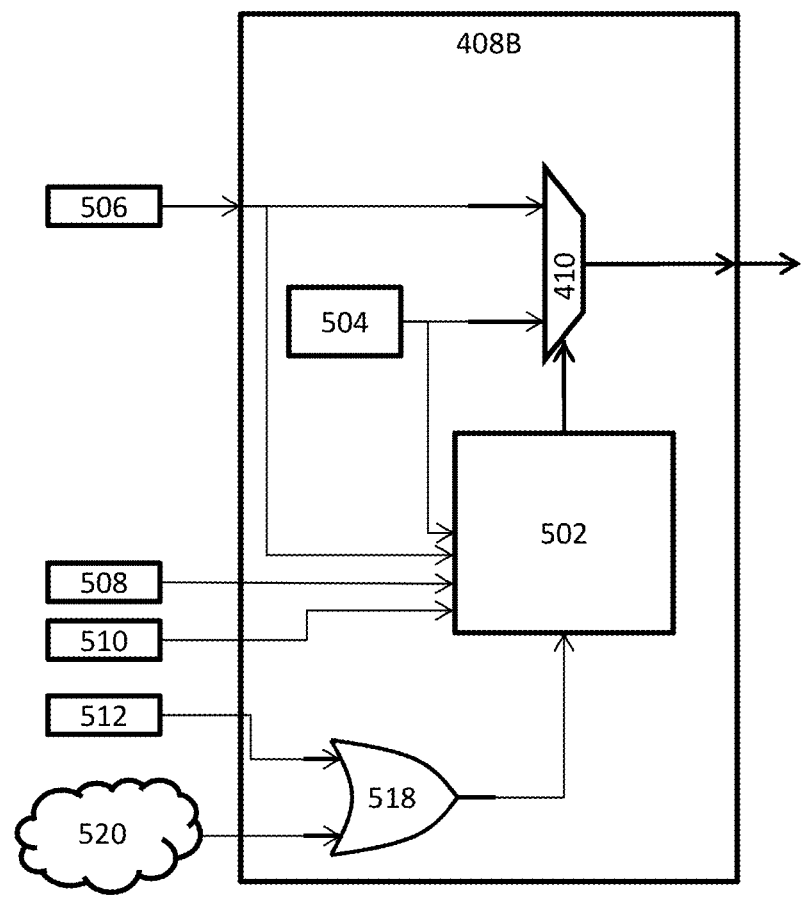
FIG. 5C illustrates another simplified diagram of an example for a counter abstraction module in one or more embodiments.

FIG. 5C illustrates another simplified diagram of an example for a counter abstraction module in one or more embodiments. The differences in this counter abstraction module example and the one illustrated in FIG. 5B are that the signal 512 may include a disable signal, one or more reset signals, one or more custom expressions, other similar signals (e.g., one or more valid signals that are not shown). Signal 512 is also received at an electronic logic gate (e.g., an OR gate) 518 that may further receive input from a complex logic module 520 (e.g., a sequential logic module, a combinational logic module, etc.) to attach the output of the complex logic module 520 to signal 512 to generate an aggregated disable signal that provides more detailed control over the behavior of the prediction module 502 (e.g., to impose how a plurality of reset signals are to be processed). This aggregated disable signal is further transmitted to the prediction module 502 to generate the corresponding select signal for the multiplexer 410.

Figure 6A:
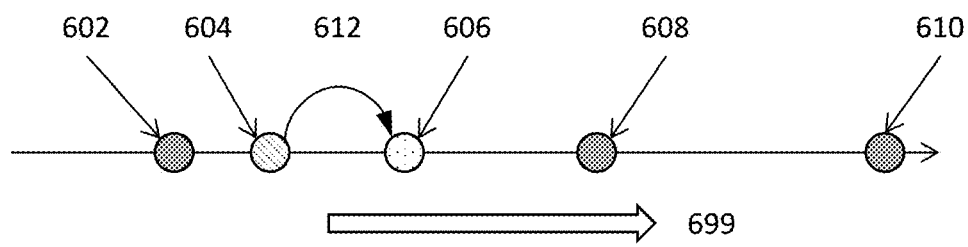
FIGS. 6A-E illustrate some examples of counter value transitions in one or more embodiments.

FIGS. 6A-E illustrate some examples of counter value transitions in one or more embodiments. More specifically, FIG. 6A illustrates an example of state transition along a direction 699 of counter progression. In this example, nodes 602, 608, and 610 represent three consecutive critical values—$CV_1$, $CV_2$, and $CV_3$. Node 604 represents the current counter value; node 606 represents the original next counter value (e.g., an original next counter value generated by an increment logic module) into which the counter may transition; and the curved arrowhead 612 denotes the transition between two counter values. In this example, the counter acceleration techniques described herein may identify the critical values 602 and 608 that range the current counter value 604. Depending upon whether the engine synthesized next counter value selected by the counter value synthesis module is valid, these counter acceleration techniques may determine whether the counter is to be accelerated from the current counter value to either the original next counter value 606 or the engine synthesized next counter value.

Figure 6B:
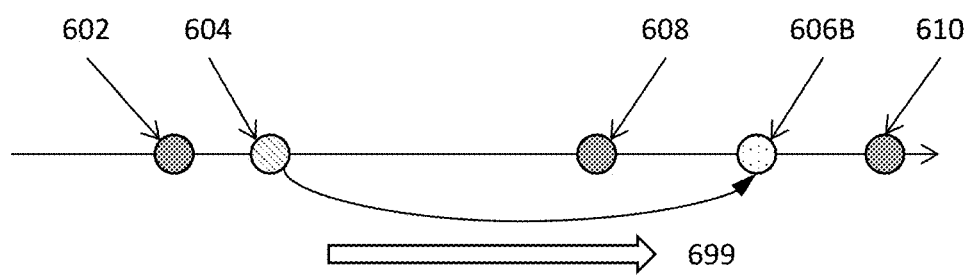

FIG. 6B illustrates another example of state transition along a direction 699 of counter progression. In this example, nodes 602, 608, and 610 represent three consecutive critical values—$CV_1$, $CV_2$, and $CV_3$ as in FIG. 6A. Nodes 604 and 606B also respectively denote the current counter value and the original next counter value (e.g., an original next counter value generated by an increment logic module). This example illustrated in FIG. 6B illustrates an invalid transition from 604 to node 606B because the transition crosses and hence skips the critical value 608. Skipping a critical value may cause undesirable results in the verification of electronic designs. Therefore, the counter abstraction module may prevent this type of transitions from occurring, and the prediction module may generate a select signal to instruct the multiplexer in the counter abstraction module to select the original next counter value for the counter in some embodiments.

Figure 6C:
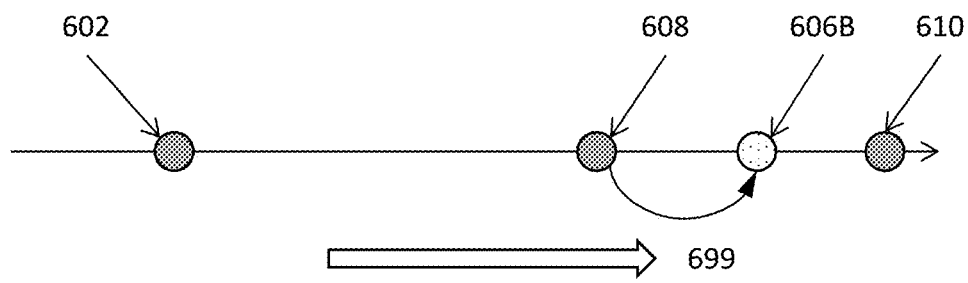

FIG. 6C illustrates another example of state transition along a direction 699 of counter progression. In this example, nodes 602, 608, and 610 represent three consecutive critical values—$CV_1$, $CV_2$, and $CV_3$ as in FIGS. 6A-B. In this example, the current counter value is a critical value (608). In this example, transitioning from a critical value using an engine synthesized next counter value may result in loss of important information or values, depending upon the counter value transitioned to. Therefore, the counter abstraction module may also prevent this type of transitions from occurring when the value being analyzed is the engine synthesized next counter value, and the prediction module may generate a select signal to instruct the multiplexer in the counter abstraction module to select the original next counter value for the counter in some embodiments.

Figure 6D:
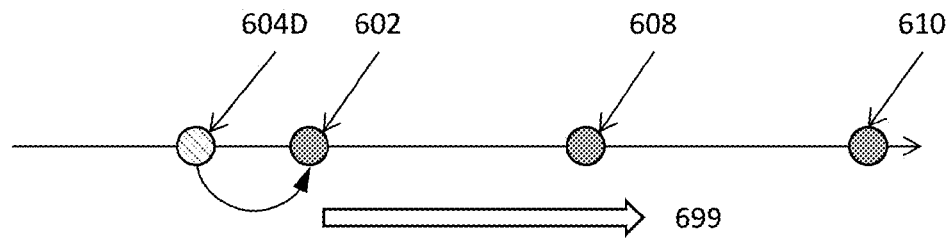
Figure 6E:
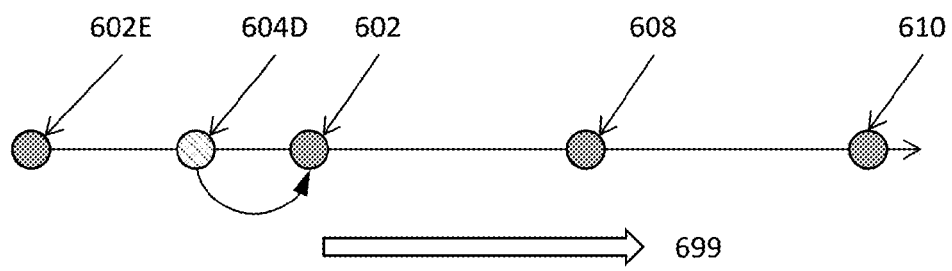

FIG. 6D illustrates another example of state transition along a direction 699 of counter progression. In this example, nodes 602, 608, and 610 represent three consecutive critical values—$CV_1$, $CV_2$, and $CV_3$ as in FIGS. 6A-D. Nodes 604D denotes the current counter value that precedes all critical values. In this example, the transition is to advance the current counter value 604D to the first critical value 602. Such a transition may be illegal in some embodiments unless a critical value (e.g., 602E in FIG. 6E) is assigned at the beginning of the flow. In some embodiments, the counter abstraction module may also prevent this type of transitions from occurring, and the prediction module may generate a select signal to instruct the multiplexer in the counter abstraction module to select the original next counter value for the counter in some embodiments. In some other embodiments, the counter abstraction module may allow this type of transitions to occur. The transition illustrated in FIG. 6E where a critical value (e.g., $CV_0$) is automatically assigned to the beginning of the flow, this transition resembles that illustrated in FIG. 6A, and the counter abstraction module may thus allow this type of transitions to occur.

Figure 6F:
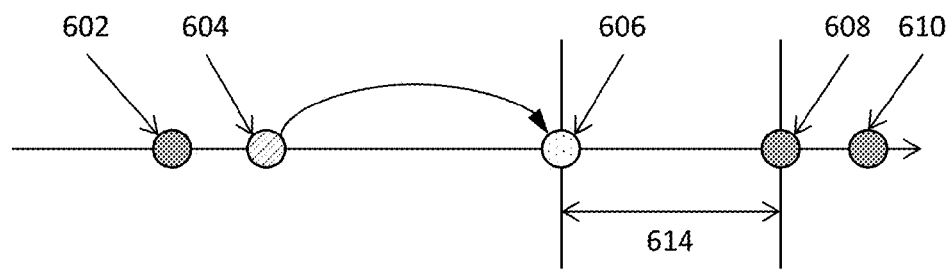
FIG. 6F illustrates an example of a valid range for engine synthesized counter next values in one or more embodiments.

FIG. 6F illustrates an example of a valid range for engine synthesized counter next values in one or more embodiments. In this example, nodes 602, 608, and 610 represent three consecutive critical values—$CV_S$, $CV_2$, and $CV_3$ as in FIGS. 6A-E. Nodes 604 denotes the current counter value, and node 606 denotes an original next counter value generated by, for example, the increment logic module. The current counter value is ranged by two consecutive critical values 602 and 608. The range 614 corresponds to the original next counter value 606 (exclusive) and the next critical value 608 (inclusive). This range 614 denotes a valid range within which engine synthesized next counter values may be selected in some embodiments. That is, if the prediction module determines that these two critical values that range the current counter value also range the engine synthesized next counter value, and that the engine synthesized next counter value falls with the range 614, the prediction module in the counter abstraction module may instruct the multiplexer to select the engine synthesized next counter value as the output to the counter to accelerate the counter from the current counter value 604 to the engine synthesized next counter value.

System Architecture Overview

Figure 7:
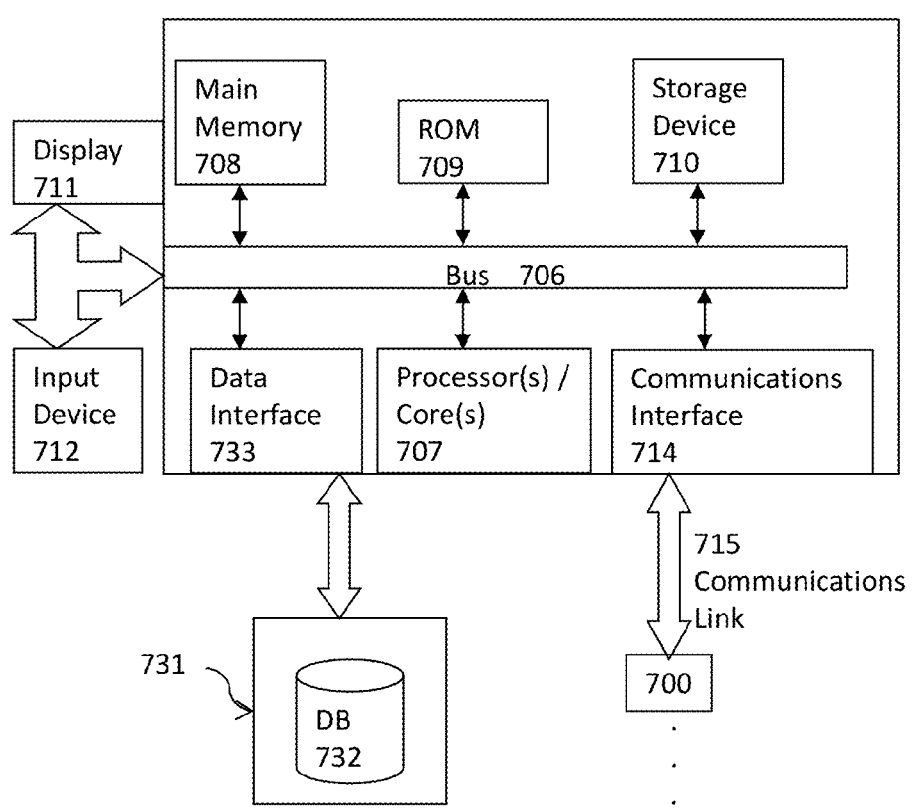
FIG. 7 illustrates a computerized system on which a method for enhancing formal verification with counter acceleration for electronic designs may be implemented.

FIG. 7 illustrates a block diagram of an illustrative computing system 700 suitable for enhancing formal verification with counter acceleration for electronic designs as described in the preceding paragraphs with reference to various figures. Computer system 700 includes a bus 806 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

According to one embodiment, computing system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, various acts of determination, compression, decompression, etc. may be performed by one or more mechanisms (e.g., one or more mechanisms described in FIG. 1) including or functioning in tandem with one or more processors, one or more processor cores, or combination thereof.

A mechanisms described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanisms or modules.

A mechanism or module described herein or an equivalent thereof may perform its respective functions alone or in conjunction with one or more other mechanisms. A mechanism or module described herein or an equivalent thereof may thus invoke one or more other mechanisms or modules by, for example, issuing one or more commands or function calls. The invocation of one or more other mechanisms may be fully automated or may involve one or more user inputs. To the extent that a mechanism or module includes a piece of software, the software is stored in a non-transitory computer accessible storage medium such as computer memory.

The term "computer readable storage medium" or "computer usable storage medium" as used herein refers to any non-transitory medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, i.e., application code, through communication link 715 and communication interface 714. Received program code may be executed by processor 707 as it is received, and/or stored in disk drive 710, or other non-volatile storage for later execution. In an embodiment, the computing system 700 operates in conjunction with a data storage system 731, e.g., a data storage system 731 that includes a database 732 that is readily accessible by the computing system 700. The computing system 700 communicates with the data storage system 731 through a data interface 733. A data interface 733, which is coupled with the bus 706, transmits and receives electrical, electromagnetic or optical signals that include data streams representing various types of signal information, e.g., instructions, messages and data. In embodiments of the invention, the functions of the data interface 733 may be performed by the communication interface 714.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer-implemented method for enhancing formal verification with counter acceleration for electronic designs, the computer-implemented method comprising:
   identifying at least a portion of an electronic design that includes a counter having a current counter value;
   intercepting, with a counter abstraction module, next counter values transmitted to the counter; and
   determining whether to accelerate the counter from the current counter value to an engine synthesized next counter value, rather than to an original next counter value, based in part or in whole upon a set of critical values.

2. The computer-implemented method of claim 1, further comprising:
   inserting the counter abstraction module between the counter and an increment logic module to intercept the next counter values before the next counter values are received at the counter; and
   identifying the set of critical values at least one of which is compared to or with the current counter value.

3. The computer-implemented method of claim 2, further comprising:
   receiving, at the counter abstraction module, the current counter value from the counter;
   receiving, at the counter abstraction module, the original next counter value from the increment logic module; and
   receiving, at the counter abstraction module, at least two critical values from the set of critical values.

4. The computer-implemented method of claim 1, further comprising:
   identifying a multiplexer that receives at least the original next counter value and the engine synthesized next counter value as inputs; and
   selecting either the original next counter value or the engine synthesized next counter value based in part or in whole upon one or more criteria.

5. The computer-implemented method of claim 4, further comprising:
   determining whether the engine synthesized next counter value is valid.

6. The computer-implemented method of claim 5, further comprising:
   receiving, at a prediction module in the counter abstraction module, the current counter value from the counter;
   receiving, at both the prediction module and the multiplexer, the engine synthesized next counter value;
   receiving, at the prediction module, at least two critical values from the set of critical values; and
   receiving, at the prediction module, the original next counter value.

7. The computer-implemented method of claim 6, further comprising:
   generating a select signal for the multiplexer based in part or in whole upon the at least two critical values, the original next counter value, the current counter value, and the engine synthesized next counter value;
   selecting either the original next counter value or the engine synthesized next counter value based in part or in whole upon the select signal; and
   accelerating the counter from the current counter value to the engine synthesized next counter value when the select signal enables the counter abstraction module to accelerate the counter.

8. The computer-implemented method of claim 1, further comprising:
   aggregating one or more reset signals, one or more valid signals, one or more expressions, or any combinations thereof into a disable signal;
   determining whether the disable signal is received to prevent the counter abstraction module from acting;
   disabling the counter abstraction module with the disable signal; and
   selecting the original next counter value, rather than the engine synthesized next counter value.

9. The computer-implemented method of claim 1, the determining whether to accelerate the counter further comprising:
   detecting a direction in which the counter is progressing;
   determining at least two critical values that range the current counter value from the set of critical values;
   determining a valid range based in part or in whole upon the at least two critical values, the current counter value, and the original next counter value; and
   determining whether the engine synthesized next counter value falls within the valid range.

10. The computer-implemented method of claim 9, wherein the valid range exclusively includes the original next counter value as a lower bound and inclusively includes one of the at least two critical values as an upper bound.

11. A system for enhancing formal verification with counter acceleration for electronic designs, comprising:
   one or more mechanisms, at least one of which is stored in part or in whole in memory and comprises at least one processor including one or more processor cores executing one or more threads in a computing system;
   a non-transitory computer accessible storage medium storing thereupon program code that includes a sequence of instructions that, when executed by the at least one processor, causes the at least one processor at least to:
   identify at least a portion of an electronic design that includes a counter having a current counter value;
   intercept, with a counter abstraction module, next counter values transmitted to the counter; and
   determine whether to accelerate the counter from the current counter value to an engine synthesized next counter value, rather than to an original next counter value based in part or in whole upon a set of critical values.

12. The system of claim 11, wherein the program code includes the sequence of instructions that, when executed by the at least one processor, further cause the at least one processor to:
   aggregate one or more reset signals, one or more valid signals, one or more expressions, or any combinations thereof into a disable signal;
   determine whether the disable signal is received to prevent the counter abstraction module from acting;
   disable the counter abstraction module with the disable signal; and
   select the original next counter value, rather than the engine synthesized next counter value.

13. The system of claim 11, wherein the program code includes the sequence of instructions that, when executed by the at least one processor, further cause the at least one processor to:
   detect a direction in which the counter is progressing;
   determine at least two critical values that range the current counter value from the set of critical values;
   determine a valid range based in part or in whole upon the at least two critical values, the current counter value, and the original next counter value; and
   determine whether the engine synthesized next counter value falls within the valid range.

14. The system of claim 11, wherein the program code includes the sequence of instructions that, when executed by the at least one processor, further cause the at least one processor to:
   insert the counter abstraction module between the counter and an increment logic module to intercept the next counter values before the next counter values are received at the counter; and
   identify the set of critical values at least one of which is compared to or with the current counter value.

15. The system of claim 14, wherein the program code includes the sequence of instructions that, when executed by the at least one processor, further cause the at least one processor to:
   receive, at the counter abstraction module, the current counter value from the counter;
   receive, at the counter abstraction module, the original next counter value from the increment logic module; and
   receive, at the counter abstraction module, at least two critical values from the set of critical values.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for enhancing formal verification with counter acceleration for electronic designs, the set of acts comprising:
   identifying at least a portion of an electronic design that includes a counter having a current counter value;
   intercepting, with a counter abstraction module, next counter values transmitted to the counter; and
   determining whether to accelerate the counter from the current counter value to an engine synthesized next counter value, rather than to an original next counter value based in part or in whole upon a set of critical values.

17. The article of manufacture of claim 16, the set of acts further comprising:
   identifying a multiplexer that receives at least the original next counter value and the engine synthesized next counter value as inputs; and
   selecting either the original next counter value or the engine synthesized next counter value based in part or in whole upon one or more criteria.

18. The article of manufacture of claim 17, the set of acts further comprising:
   determining whether the engine synthesized next counter value is valid.

19. The article of manufacture of claim 18, the set of acts further comprising:
   receiving, at a prediction module in the counter abstraction module, the current counter value from the counter;
   receiving, at both the prediction module and the multiplexer, the engine synthesized next counter value;
   receiving, at the prediction module, at least two critical values from the set of critical values; and
   receiving, at the prediction module, the original next counter value.

20. The article of manufacture of claim 19, the set of acts further comprising:
   generating a select signal for the multiplexer based in part or in whole upon the at least two critical values, the original next counter value, the current counter value, and the engine synthesized next counter value;
   selecting either the original next counter value or the engine synthesized next counter value based in part or in whole upon the select signal; and accelerating the counter from the current counter value to the engine synthesized next counter value when the select signal enables the counter abstraction module to accelerate the counter.

* * * * *